US010727767B2

(12) United States Patent
Samuel et al.

(10) Patent No.: US 10,727,767 B2
(45) Date of Patent: Jul. 28, 2020

(54) PACKET-BASED NETWORKING OF VARIABLE FREQUENCY DRIVES

(71) Applicant: Kimidrive LLC, Santa Clara, CA (US)

(72) Inventors: Michael Reda Samuel, Santa Clara, CA (US); Sami Boutros, Union City, CA (US)

(73) Assignee: KIMIDRIVE LLC, Santa Clara, CA (US)

( * ) Notice: Subject to any disclaimer, the term of this patent is extended or adjusted under 35 U.S.C. 154(b) by 0 days.

(21) Appl. No.: 16/348,449

(22) PCT Filed: Nov. 22, 2017

(86) PCT No.: PCT/US2017/063084
§ 371 (c)(1),
(2) Date: May 8, 2019

(87) PCT Pub. No.: WO2018/098333
PCT Pub. Date: May 31, 2018

(65) Prior Publication Data
US 2019/0312537 A1 Oct. 10, 2019

Related U.S. Application Data

(60) Provisional application No. 62/425,711, filed on Nov. 23, 2016.

(51) Int. Cl.
*H02P 7/29* (2016.01)
*G05B 19/05* (2006.01)
(Continued)

(52) U.S. Cl.
CPC .............. *H02P 7/29* (2013.01); *G05B 19/056* (2013.01); *H02P 6/12* (2013.01); *H02P 29/027* (2013.01);
(Continued)

(58) Field of Classification Search
CPC ...... H02P 1/00; H02P 1/04; H02P 1/16; H02P 1/163; H02P 1/24; H02P 1/26; H02P 1/265; H02P 1/30; H02P 1/426; H02P 1/46; H02P 1/465; H02P 1/54; H02P 27/08; H02P 3/00; H02P 3/18; H02P 4/00; H02P 5/00;
(Continued)

(56) References Cited

U.S. PATENT DOCUMENTS 6,995,537 B1    2/2006  Plutowski et al.
10,148,202 B2 *  12/2018  Frampton ............... B60L 1/003
(Continued)

FOREIGN PATENT DOCUMENTS

WO      2016002030 A1    1/2016

*Primary Examiner* — Antony M Paul
(74) *Attorney, Agent, or Firm* — Coats & Bennett, PLLC

(57) ABSTRACT

One or more Variable Frequency Drives (VFD) are connected to a packet network and the power transistor drive signals normally generated by the VFD to produce a desired Pulse Width Modulated (PWM) motor drive signal are generated by a software controller located in the packet network and transmitted to the VFD. The control of the VFDs can be (1) centralized using some centralized software controller communicating to the VFDs over the packet network, and/or (2) distributed, in which case VFDs can peer with each other over the packet network, to communicate control state.

24 Claims, 12 Drawing Sheets

(51) Int. Cl.
*H04L 25/49* (2006.01)
*H04L 29/08* (2006.01)
*H02P 29/66* (2016.01)
*H02P 6/12* (2006.01)
*H02P 29/024* (2016.01)
*H02P 29/68* (2016.01)

(52) U.S. Cl.
CPC .......... *H02P 29/0241* (2016.02); *H02P 29/66* (2016.02); *H02P 29/68* (2016.02); *H04L 25/4902* (2013.01); *H04L 67/12* (2013.01); *G05B 2219/13004* (2013.01); *G05B 2219/15117* (2013.01)

(58) Field of Classification Search
CPC ...... H02P 5/46; H02P 5/74; H02P 6/00; H02P 6/04; H02P 6/14; H02P 23/00; H02P 23/0027; H02P 23/08; H02P 27/00; H02P 27/04; H02P 27/06; H02P 2005/408; G05B 11/28; B25J 9/16
USPC ..... 318/400.01, 400.14, 700, 701, 727, 799, 318/800, 801, 430; 340/4.42, 4.62, 5.61, 340/5.64, 13.24; 345/2.3; 705/14.64
See application file for complete search history.

(56) References Cited

U.S. PATENT DOCUMENTS

| | | |
|---|---|---|
| 2001/0002785 A1 | 6/2001 | Gotou |
| 2014/0030984 A1 | 1/2014 | Wagoner et al. |
| 2015/0084563 A1* | 3/2015 | Lucas .................... H02J 3/383 318/400.29 |
| 2016/0056639 A1 | 2/2016 | Mao |
| 2016/0233809 A1 | 8/2016 | Jetti et al. |

* cited by examiner

PACKET-BASED NETWORKING OF VARIABLE FREQUENCY DRIVES

This application claims priority to U.S. Provisional Patent Application Ser. No. 62/425,711, filed 23 Nov. 2016, the disclosure of which is incorporated herein by reference in its entirety.

TECHNICAL FIELD

The present disclosure relates generally to variable frequency drives (VFD) and, more particularly, to the control of VFDs via a packet-switched network.

BACKGROUND

The operational properties of electric motors—speed, torque, starting, braking, and the like—are controlled by the amount and timing of electric current applied to the motor. One common form of controlled current application is Pulse Width Modulation (PWM), in which the duty cycle of a pulsed, or square-wave, signal is controlled to provide an average current of a desired amount between zero and a maximum level. An electronic Variable Frequency Drive (VFD) is a circuit that generates a PWM current signal to drive a motor.

FIG. 1 presents a block diagram of a representative VFD 10 providing a drive signal for a motor 16. Generally speaking, VFD 10 comprises a power section 12, which generates the output current, and a controller 14, which controls the power section 12 according to programmed and/or user-input parameters. VFD 10 is conventionally connected in a circuit and controlled via a potentiometer, a local Programmable Logic Controller (PLC), or another VFD 10, depending on the complexity of the required motor control and the application.

A simple way to explain the functionality of a VFD 10 is to liken the controller 14, the power section 12 and the motor it drives to the brain, the muscles and the rest of the human body, respectively. When a certain motion profile is desired from the body, the brain sends to the muscles the necessary electric signals to move a body part in precisely the desired way. Feedback signals sent to the brain via the nervous system impart to the brain the location of the body part, its speed, and the resistance it experiences, if any. The sensors that measure these quantities in a human body are the eyes and the muscles themselves. If the weight of the body or external loads is hindering the desired motion profile, the eyes communicate to the brain, in a sense, the actual speed which the brain may find to be below the desired one. Also, the muscles inform the brain about their need for more contraction to generate enough force to overcome resisting loads. In the VFD world, the eye is an incremental speed encoder or resolver mounted on the motor shaft, and the muscle contraction is the VFD's output current delivered to the motor. Muscles contain a mechanism that measures such contractions. Similarly, the power section 12 contains current sensors to measure the current it delivers to the motor 16 and feed it back to the controller (brain).

In current state of the art three-phase motors, the power section 12 includes six power transistors such as insulated-gate bipolar transistors (IGBTs) or MOSFETs, each with an antiparallel free-wheeling diode. The IGBTs or MOSFETs are arranged in three half-bridges with each half-bridge consisting of two transistors: an upper one and a lower one connected to the positive and negative rails of a DC link respectively. The motor current is output from the midpoint between the upper and lower transistors of each half-bridge. In some cases, there is a seventh transistor that acts as a voltage chopper in electric braking. This additional transistor turns on and off in such a manner to keep the DC link voltage within a certain admissible range in order to avoid excessive voltage increase during electric braking. In modern VFDs 10, the six (or seven) transistors exist in one enclosure called an IGBT module, a transistor module, or a power module, possibly also with a voltage rectifier and possibly transistor gate driver circuitry is also incorporated. The power section 12 also sends various feedback signals to the controller 14, indicating output current, the DC link voltage, the transistor module's temperature, the actual motor shaft speed and/or position, various fault signals indicating overvoltage or overcurrent in the power section 12, and the like.

The controller 14 produces the six (or seven) 'gate' signals that operate to switch the power transistors on and off. These gate signals cause the transistors to generate a PWM voltage, the fundamental frequency of which closely tracks the required instantaneous speed of the driven motor.

Taking the previous metaphor between a VFD 10 and a human body one step further, the decision to perform a certain motion profile can originate locally in the brain, or be transmitted to it from another external master or peer. In the drive automation parlance, the first case corresponds to a VFD controller 14 sophisticated enough to be programmed to produce complex motion profiles depending on external observations. The second case corresponds to a VFD 10 taking its commands from a master controller 18, also depicted in FIG. 1. The master controller 18 may be a programmable logic controller (PLC) driving a group of VFDs 10 in one location, a master VFD 10 in a master/slave connection scenario, or a peer VFD 10 in a decentralized installation scenario. One example of the later control arrangement is in partitioned conveyor applications, where each partition of the conveyor is run by a separate drive (combination of VFD 10 and motor 16). In this application, proximity sensors or neighboring VFDs 10 communicate to a VFD 10 when to take over and when to stop. As depicted in FIG. 1, the master controller 18 may provide high-level commands to the VFD 10, such as speed, position, or torque setpoints, and various parameter settings; the VFD 10 may additionally provide feedback signals to the master controller 18.

In current state-of-the-art technology:
- The controller 14 and the power section 12 are in the same enclosure; either on the same printed circuit board (PCB) or on different boards connected together via header connectors.
- The controller 14 issues gate signals to the power transistors to switch them on and off in order to generate the PWM signal needed to drive the motor according to a preset speed profile. Said speed profile can be dictated by a master (external) controller 18, a program (instruction set) stored locally on the VFD 10, or set manually via a potentiometer.
- The external master controller 18 is usually a PLC co-located with the VFD 10. PLC programming is not a trivial task. Also in some applications, conditions can be very harsh for a co-located master controller installation (accessibility, cable length, elevation, temperature, dust, etc.).
- The master controller 18 sends only higher-level signals, such as speed or position set point as an analog or digital signal over a wire cable. The VFD 10 is instructed to react to these inputs via a program stored locally. The controller 14 generates the gate signals for the power transistors based on the master controller high level inputs.

If one wants to change the program in the VFD 10, it cannot be done on the fly. A personal computer or a laptop must be connected to the VFD 10 via a standard interface (e.g., USB) to edit or update the program. If such changes have to be done frequently, it will be a cumbersome task.

The connection between the master controller 18 and the VFD 10 can be a wireless one (e.g., via Bluetooth or wireless Profibus) to avoid cabling costs and maintenance (although this is rarely the case in reality), but still the master controller 18 must be co-located with the VFD 10, and it does not generate or issue gate signals. It only issues set points and the controller 14 translates them into gate signals according to its local programming. This is necessary to meet the strict timing requirements of the gate signals, which directly switch the power transistors to generate the PWM motor drive signal.

The VFD 10 contains sufficient memory on board to store the values of its parameter set: speed limits, current limits, speed ramp up and down times, etc., as well as the definition of its analog and digital I/Os. For instance, the first digital input may be made to correspond to run/stop, etc. A more advanced VFD 10 may also carry a certain instruction set that tells the VFD 10 to perform a motion profile and react in a certain way to outside inputs.

An actual VFD 10 will include additional circuits not depicted in the block diagram of FIG. 1. For example, a VFD 10 may contain a DC power supply providing operating power to various electronic boards, a heat sink to dissipate excessive heat generated by power transistors, a gate driver circuit that acts as a current amplifier to strengthen the "weak" gate signals issued by the controller and make them capable of driving the power transistors, a means of input/output such as a keypad or a screen for the operator to inspect and give control commands and other accessories, and the like.

The Background section of this document is provided to place embodiments of the present invention in technological and operational context, to assist those of skill in the art in understanding their scope and utility. Approaches described in the Background section could be pursued, but are not necessarily approaches that have been previously conceived or pursued. Unless explicitly identified as such, no statement herein is admitted to be prior art merely by its inclusion in the Background section.

BRIEF SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

In exemplary embodiments of the disclosure, one or more VFDs are connected to a packet network and some of the control functions normally performed by the VFD controller(s) are performed by a software controller located in the packet network. The packet network could be a wired or wireless network. The control of the VFDs can be (1) centralized using some centralized software controller communicating to the VFDs over the packet network, and/or (2) distributed, in which case VFDs can peer with each other over the packet network, to communicate control state—such as for example a VFD asking the next VFD on a conveyor belt to take over. In other words, in the proposed invention:

Control can be geographically separated from the VFD, so a larger, more powerful computer or a handheld device can be used to monitor or remotely control the VFD.

Controller issues not only higher level commands but rather the low-level gate signals themselves to turn power transistors on and off to realize its desired motion profile.

Those gate signals are computed at the remote computer and sent to the VFD over the packet network in the downlink direction.

Controller receives detailed feedback on instantaneous motor speed, motor temperature, transistor temperature, motor torque, motor current, DC bus voltage, etc., to aid in generating the gate signal computations. These feedback signals are transmitted over the packet network in the uplink direction.

A L2/L3 network address is assigned to each of a plurality of VFDs, and any VFD may be monitored and controlled remotely like any enterprise IT application.

Data between the VFD and the external controller is transmitted in blocks (packets) in both directions. One or more packet format encodings are proposed, to carry the necessary bits to encode what's needed to control/monitor a given VFD. A simple transport protocol such as IP or UDP may be used to carry the packet frames between the VFD(s).

Data packets are transmitted within transmission time intervals (TTIs).

One TTI is needed every PWM period and carries a small amount of information. Typical PWM frequency is 4, 8, 12 or 16 kHz which can be easily supported by a packet network.

In order to scale, a federation of controllers (SW PLC) is able to scale out and control/monitor more VFD(s). The federation of controllers can additionally provide active/active and active/standby redundancy.

Converging to the packet network for the control/monitor of a network of VFD(s) will benefit from the resiliency and redundancy available in the packet network. Software controllers can run on premise or remotely from a public cloud. Control can also be provided via mobility application. This control could be from a centralized controller or could be from one (super) VFD to another VFD.

One embodiment relates to a method of controlling one or more VFDs, each VFD configured to generate a PWM signal to drive a motor. For each controlled VFD, a plurality of drive signals are calculated; the drive signals configured to switch a plurality of power transistors in the VFD for a time interval, to generate a desired PWM signal. The plurality of drive signals is wirelessly transmitted to each controlled VFD, in advance of the time interval in which they are to be applied, in at least a main downlink (DL) frame of a transmission packet. Another embodiment relates to a controller configured to control one or more VFDs, each VFD configured to generate a PWM signal to drive a motor. The controller includes a wireless transceiver and a processor operatively connected to the wireless transceiver. The processor is configured to, for each controlled VFD, calculate a plurality of drive signals to switch a plurality of power transistors in the VFD for a time interval, to generate a desired PWM signal. The processor is further configured to wirelessly transmit the plurality of drive signals, to each controlled VFD, in advance of the time interval in which they are to be applied, in at least a main downlink (DL) frame of a transmission packet.

Yet another embodiment relates to a method of generating a PWM signal to drive a motor, by a VFD controlled by a remote controller. A plurality of drive signals for a time interval is wirelessly received from the controller, in a main downlink (DL) frame of a received packet. In a subsequent time interval, a plurality of power transistors is switched, according to the received drive signals, to generate the PWM signal.

Still another embodiment relates to a VFD configured to generate a PWM signal to drive a motor. The VFD is controlled by a remote controller and includes a wireless transceiver and a processor operatively connected to the wireless transceiver. The processor is configured to wirelessly receive from the controller, in a main downlink (DL) frame of a received packet, a plurality of drive signals for a time interval; and in a subsequent time interval, switch a plurality of power transistors, according to the received drive signals, to generate the PWM signal.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention. Also, similar reference numbers are used in the Figures to refer to similar components.

Figure 1:
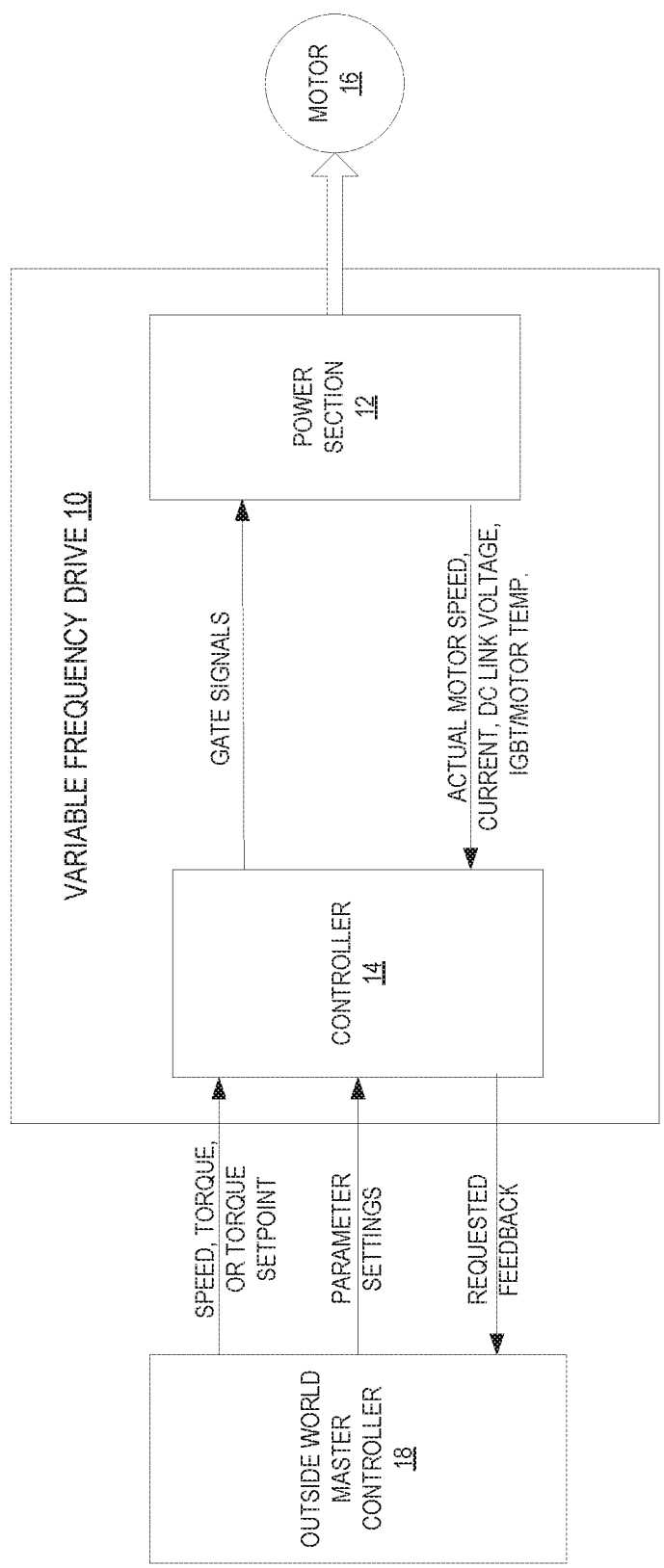
FIG. 1 is a block diagram of a conventional VFD.
Figure 2:
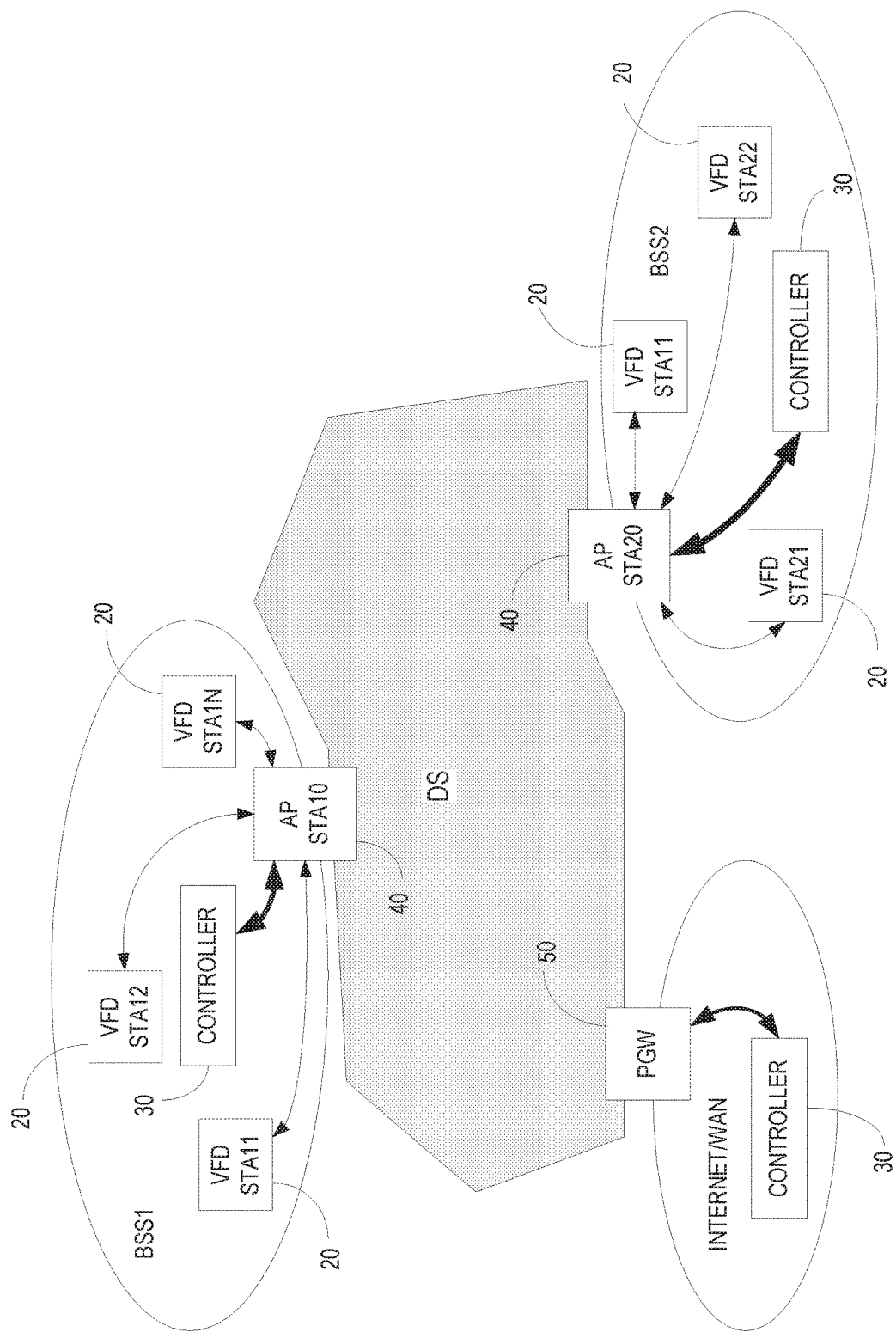
FIG. 2 illustrates a network of VFDs according to an embodiment of the disclosure

FIG. 2 illustrates a new connection scheme between VFDs 20 on a certain site. This connection scheme allows the VFDs 20 to communicate with each other as well as with the outside world. Each VFD 20 can be viewed as a node in an Internet-of-Things (IoT) network and the backbone is a packet-based network. One can view a group of VFDs 20 at one location as the stations (STA) of a basic service set (BSS) in a packet network (e.g., 802.11xx) with one access point (AP) 40 per BSS that connects its VFDs to 1) a master controller 30 co-located in the same BSS; 2) a distribution system (DS) that binds more than one BSS; and/or 3) a packet gateway 50 that transfers data to/from the wired world. As will be described in more detail below, the connection scheme enables the generation of the low level gate signals that operate to switch the power transistors in the power section 22 (FIG. 10) of the VFD 20 to be moved to the master controller 30. In an alternative embodiment, the AP 40 acting as a mediator between the VFD 10 and the controller 20 can be eliminated altogether or integrated in the controller 20 itself.

FIG. 2 depicts a packet-based VFD network according to one or more embodiments including a plurality of VFD 20 in two groups, labeled BSS1 and BSS2. FIG. 2 also shows the possibilities for locating a master controller 30. It can be co-located in the same BSS, in a different BSS, or geographically separated from the industrial site. This is why a packet gateway 50 is needed to connect the DS to the wired Internet to carry over the data to and from the controller's distant location. If a master controller 30 is co-located in the same BSS, it can even be incorporated with one of the VFDs 20, which can be thought of as a 'super VFD'. A super VFD 20 has the capabilities of driving its own load in addition to communicating with and giving drive instructions to other VFDs 20 over the packet network as explained herein. As the name suggests, uplink and downlink information are transmitted in packets between the VFD 20 and the controller 30/super VFD 20. This fits perfectly the nature of the VFD data. In the parlance of drive technology, motion control is realized by pulse width modulation (PWM), where the time dimension is divided into small intervals (PWM periods). In each interval, the controller 30 makes decisions on which power transistors (IGBTs or MOSFETs) to turn on or off in order to realize a certain average voltage and hence current within this interval.

The, PHY, MAC and Network layer protocols of a packet network such as narrowband IoT, 802.xxx or Bluetooth, or modified versions of them, may be utilized in this scenario.

Each VFD 20 will have a universal L2 or L3 address in order to destine a certain data packet to it, unlike the circuit-switched case where no address is needed. This addressing can be absolute or relative to the BSS, i.e., its address is a concatenation of an absolute group address assigned to the BSS and a relative address. If it is an L2 address, then it becomes a part of the MAC header.

The time domain is divided into short intervals equal to the PWM period (inverse of PWM frequency) or its half. Each one of these intervals is called a transmission time interval (TTI). In each of these TTIs, the VFD 20 may send an uplink (UL) packet to the controller 30 reporting values of certain physical quantities and parameters. Also in each TTI, the controller 30 sends a downlink (DL) packet instructing the VFD 20 as to which power transistors are switched on and off in the next TTI, as well as sending to it the values of some parameters.

In some embodiments, the VFD 20 is also be given the capability to run 'headless' where it regains authority over its own power transistors and issues the gate signals that turn them on and off.

UL and DL packets must carry certain information to enable the proper operation of the VFDs.

Figure 3:
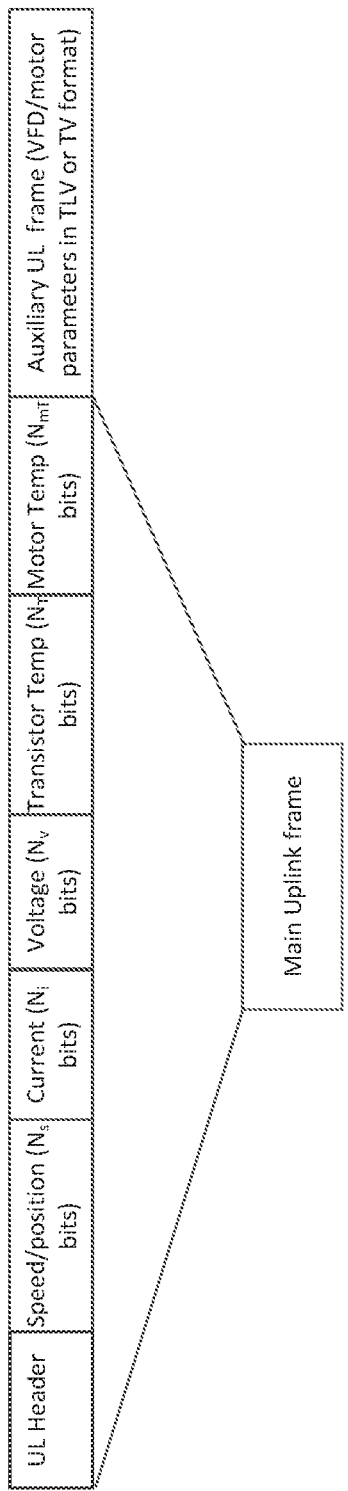
FIG. 3 illustrates a structure for uplink (UL) frames sent from a VFD to a master controller.

In the UL direction, the VFD 20 constructs a main MAC frame, referred to herein as the main uplink (UL) frame, that contains fields for, e.g., instantaneous motor speed (either estimated by the inverter or measured if an encoder is mounted on the motor shaft), instantaneous motor current, IGBT module temperature, rotor temperature and DC bus voltage. If the processing power of the VFD 20 is not high enough to estimate the motor speed locally and report it, it can send a certain bit pattern (for example all-ones) in the speed field or in a separate field to instruct the controller 30 to do the speed estimation given reported current and voltage values. It can also indicate to the controller in a separate field whether the reported speed is measured or estimated. The fields mentioned above should have a defined order and number of bits that is known to both the VFD 20 and the controller 30. Those of skill in the art may construct bit definitions for a given application, given the teachings of this disclosure. One example is shown in FIG. 3.

The VFD 20 does not have to transmit the main UL frame every TTI. It may be instructed by the controller 30 to transmit every NT TTIs if the UL traffic becomes too high or if the operation of the VFD 20 does not require that frequent reporting.

The VFD 20 may construct a second MAC frame called an 'auxiliary UL frame' on which it reports periodically the type, length and value (TLV) or simply the type and value (TV) of its various parameters. In case it reports parameters in TV format, then the length of the value field must be known to both the VFD 20 and the controller 30. An auxiliary UL frame may be transmitted every TTI, every NT or whenever the controller 30 requests it. If the auxiliary frame is not mandated every TTI, then a field indicating its existence in the current transmission must be included in the MAC header after the address field. The new controller 30 may request the transmission of certain parameters for example in case of controller handover (one controller 30 hands over the provisioning of one VFD 20 to a new controller 30) in order for the new serving controller 30 to know the operating parameter values of the VFD 20.

Figure 4:
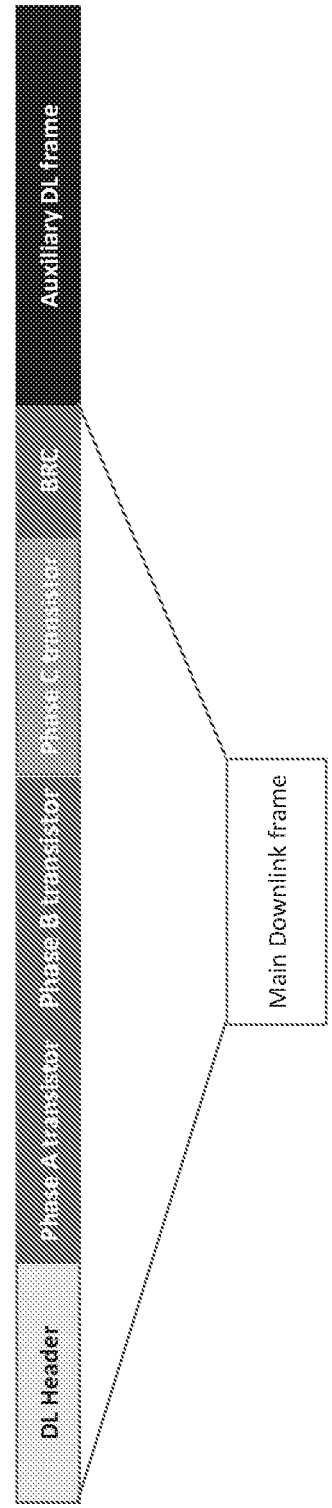
FIG. 4 illustrates a structure for downlink (DL) frames sent from a controller to a VFD.

Not all parameter values must be reported every time an auxiliary UL frame is transmitted. For example parameters defining VFD's ramp up or ramp down times do not change unless the controller 30 updates them. To reduce the unnecessary UL traffic: i) parameters can be divided into NP groups each assigned a group ID and only one group is transmitted every time an auxiliary frame is transmitted in a round robin fashion, ii) they may be transmitted only when the controller 30 requests the transmission of a certain group or iii) in controller handover scenarios, the controller 30 may request the transmission of all groups one after the other. A field in the MAC header of the main UL frame must indicate which parameter group is being transmitted. A group may contain only one parameter Downlink (DL) MAC frames from the master controller 30 to the VFD 20 comprise a main and auxiliary frames, referred to as the main DL frame and auxiliary DL frame respectively. The main DL frame contains six fields (two for each output phase) to indicate the switch on and off time offsets, relative to the beginning of the TTI, of each power transistor. A seventh field for the brake chopper (BRC) transistor may also be included. Since the switching pattern of lower transistors is the complement of the upper ones, the number of fields is reduced from six to three in one embodiment. If multilevel switching is used, the number of fields may be increased. Again, those of skill in the art may define specific fields in the main DL frame, so long as their order is known to the VFD 20 and the controller 30. An example is shown in FIG. 4.

Also, an auxiliary DL frame may be included after the main DL frame and its inclusion must be indicated by a certain field in the MAC header of the main DL frame. It may include a field requesting the VFD 20 to transmit the values of a certain parameter group or it may set parameter values in a TLV or TV format.

The fact that instructions are issued by an external master controller 30 does not discount the possibility of having an on-board controller 28 (See FIG. 11) in the VFD 20. Applications that do not tolerate a disconnection between the VFD 20 and a remote controller 30—such as vertical motion (hoist, elevator, etc.)—require an on-board controller 28 with minimal functionality, e.g., only V/F operation mode or provision to engage a mechanical brake if controller signal experience intolerable delay. In certain cases, the controller 30 may instruct the VFD 20 to run 'headless' relying on its own controller 28. In this case, it has to send the VFD 20 the set point speed at which to run as part of the auxiliary DL frame as described herein. Whenever the controller 30 again asserts control, it sends the VFD 20 a request to give up its own controller 28 and follow low-level gate signals transmitted by the controller 30 in the main DL frame. Requests from the controller 30 to the VFD 20 to run headless or to claim back leadership can be done via a certain DL header field.

At the beginning of operation, the controller 30 may instruct the VFD 20 to run a training session to collect the motor parameters. This session can be run by a local on-board controller 28 or by sending the low-level gate signals from the controller 30 to the VFD 20 as described above. The VFD 20 sends back the motor model parameters to the controller in the auxiliary frame. There must be a field in the header of the UL frame indicating if the auxiliary frame carries motor parameters or VFD parameters in TV format.

Figure 5:
FIG. 5 illustrates an exemplary header for the UL frames.

UL header should contain the fields shown in FIG. 5, but not necessarily in the shown order. The second field carries the ID of the parameter group being reported in the auxiliary field. A certain value of this field can be reserved to identify motor model parameters in the motor training process. The third and fourth fields are to acknowledge the controller request that VFD 20 run headless based on parameter values in auxiliary field or return control respectively. The last field is reserved for future use.

Figure 6:
FIG. 6 illustrates an exemplary header for the DL frames.

DL header should contain the fields shown in FIG. 6, but not necessarily in the shown order. The STA address field can be a single VFD address, a multicast address or a broadcast address. In the second field, the controller requests for the VFD 20 to transmit a certain parameter group. In the third and fourth fields, it instructs the VFD 20 to run headless or to return control to the controller 30. The last field is reserved for future use.

In some embodiments, communications between a controller 30 and VFD 20, or between VFDs 20, are made over a secure packet tunnel; this tunnel can be, e.g., an SSL VPN or an IPSec tunnel to prevent Denial of Service attacks to VFD 20. In some embodiments, an authentication mechanism is used to authenticate the secure communication between the controller and a given VFD 20.

Figure 7:
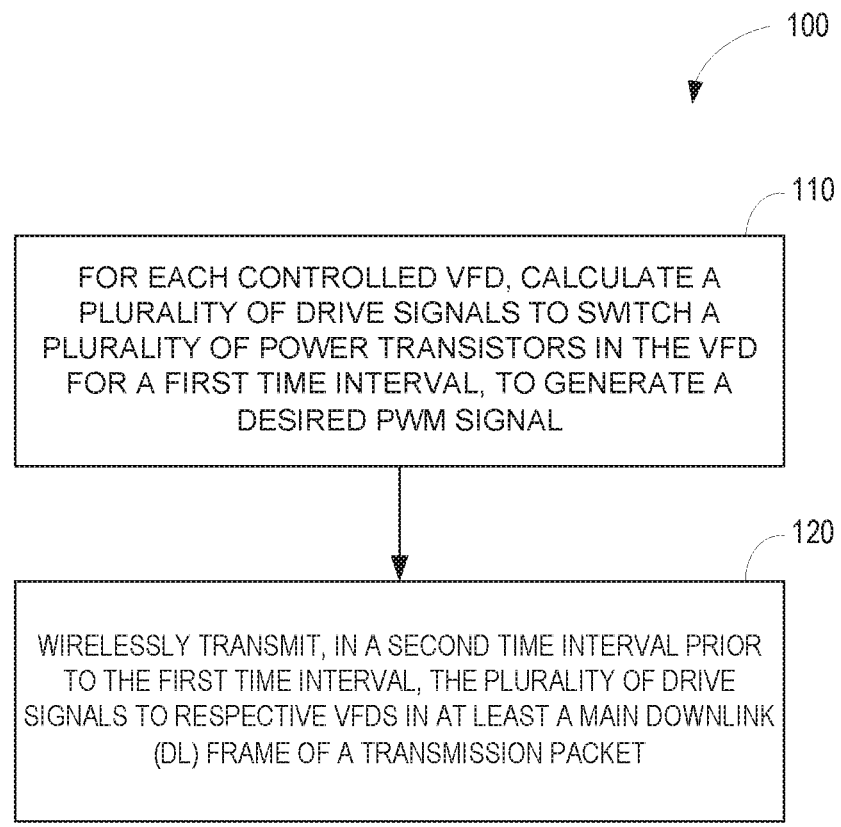
FIG. 7 illustrates an exemplary method 100 implemented by a remote controller of controlling one or more VFDs.

FIG. 7 illustrates an exemplary method 100 implemented by a remote controller 30, i.e. geographically separate, of controlling one or more VFDs 20. Each VFD 20 is configured to generate a PWM signal to drive a motor. For each controlled VFD 20, the controller 30 calculates a plurality of drive signals to switch a plurality of power transistors in the VFD 20 for a first time interval to generate a desired PWM signal (block 110). The controller 30 wirelessly transmits, in advance of the first time interval, the plurality of drive signals to respective VFDs 20 (block 120). In one embodiment, the drive signals for each VFD 20 are transmitted in downlink (DL) frames of a transmission packet.

In one embodiment of method 100, wirelessly transmitting a plurality of drive signals comprises transmitting a plurality of drive signals in a plurality of successive time intervals including the first time interval, wherein the drive signals transmitted in one of the successive time intervals is effective for the next time interval.

In one embodiment of method 100, the drive signals comprise separate indications to switch each power transistor on or off, and also indicate the timing of the switching.

One embodiment of method 100 further comprises an indication to switch a braking transistor on or off, and also indicate the timing of the switching.

In one embodiment of method 100, the timing of each transistor switching signal is an offset from the beginning of the next time interval.

One embodiment of method 100 further comprises, in one or more of the time intervals, additionally transmitting commands or parameter values to one or more VFDs in an auxiliary DL frame of the transmission packet.

In one embodiment of method 100, the same drive signals, commands, or parameter values are broadcast to two or more controlled VFDs.

In one embodiment of method 100, the drive signals, commands, or parameter values are transmitted individually to each controlled VFD.

One embodiment of method 100 further comprises transmitting a command in an auxiliary DL frame for the VFD to run autonomously, and ceasing the transmission of drive signals in a main DL frame to the autonomous VFD.

One embodiment of method 100 further comprises transmitting a command in an auxiliary DL frame for the VFD to be controlled, and resuming the transmission of drive signals in a main DL frame to the autonomous VFD.

One embodiment of method 100 further comprises, in one or more of the time intervals, receiving from one or more VFDs feedback about the VFD or motor state in a main uplink (UL) frame of a received packet.

In some embodiments of the method 100, the controller 30 is contained within a first VFD and wirelessly transmits the drive signals to a second VFD 20.

Figure 8:
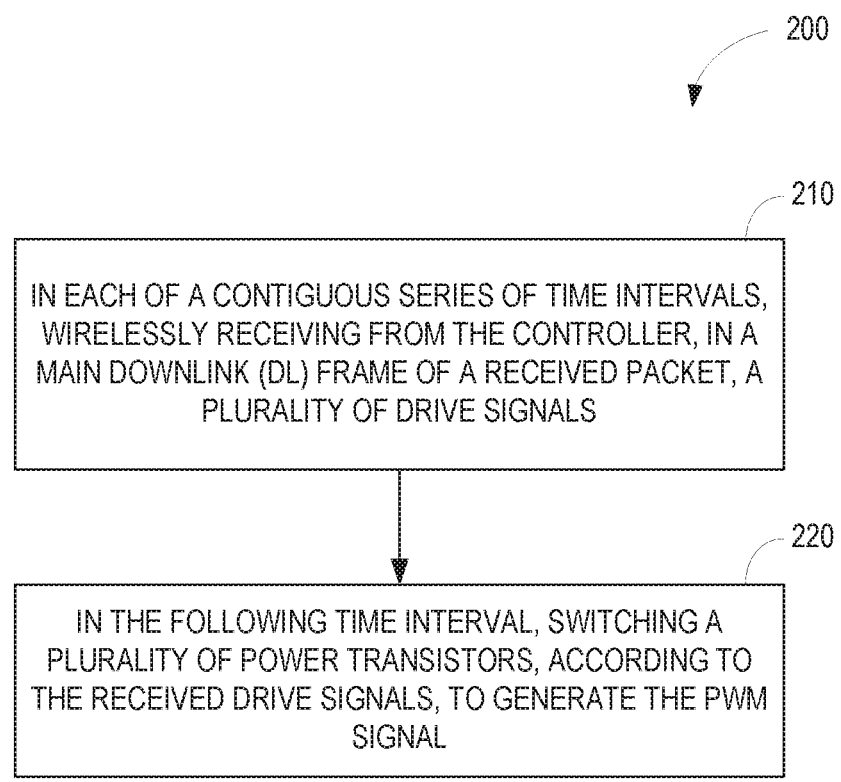
FIG. 8 illustrates an exemplary method 200 implemented by a VFD of generating a PWM signal to drive a motor.

FIG. 8 illustrates an exemplary method 200 implemented by a VFD 20 of generating a PWM signal to drive a motor where the VFD 20 is controlled by a remote, i.e. geographically separate, controller 30. The VFD 20 wirelessly receives from the controller 30, in a main downlink (DL) frame of a received packet, a plurality of drive signals for a time interval (block 210). The VFD 20, in a subsequent time interval, switching a plurality of power transistors, according to the received drive signals, to generate the PWM signal.

In some embodiments of the method 200, wirelessly receiving a plurality of drive signals comprises receiving the plurality of drive signals in each successive time interval, and wherein a subsequent time interval comprises the next time interval.

In some embodiments of the method 200, the drive signals comprise separate indications to switch each power transistor on or off, and also indicate the timing of the switching.

In some embodiments of the method 200, the drive signals further comprise an indication to switch a braking transistor on or off, and also indicate the timing of the switching.

In some embodiments of the method 200, the timing of each transistor switching signal is an offset from the beginning of the next time interval.

Some embodiments of the method 200 further comprise, in one or more of the time intervals, additionally receiving commands or parameter values in an auxiliary DL frame of the received packet.

Some embodiments of the method 200 further comprise receiving a command in an auxiliary DL frame to run autonomously, and generating drive signals to switch the transistors.

Some embodiments of the method 200 further comprise receiving a command in an auxiliary DL frame to again be controlled, and resuming switching the transistors according to drive signals received in each time interval from the controller.

Some embodiments of the method 200 further comprise, in one or more of the time intervals, wirelessly transmitting to the controller feedback about the VFD or motor state in a main uplink (UL) frame of a transmitted packet.

In some embodiments of the method 200, the feedback includes one or more of instantaneous motor speed, instantaneous motor current, power transistor temperature, motor rotor temperature, DC bus voltage, and an indication for the controller to calculate motor speed from current and voltage.

Some embodiments of the method 200 further comprise, in one or more of the time intervals, wirelessly transmitting to the controller the value of one or more parameters in an auxiliary uplink (UL) frame of a transmitted packet.

In some embodiments of the method 200, the controller 30 is contained within a first VFD and wirelessly transits the drive signals to a second VFD 20.

Figure 9:
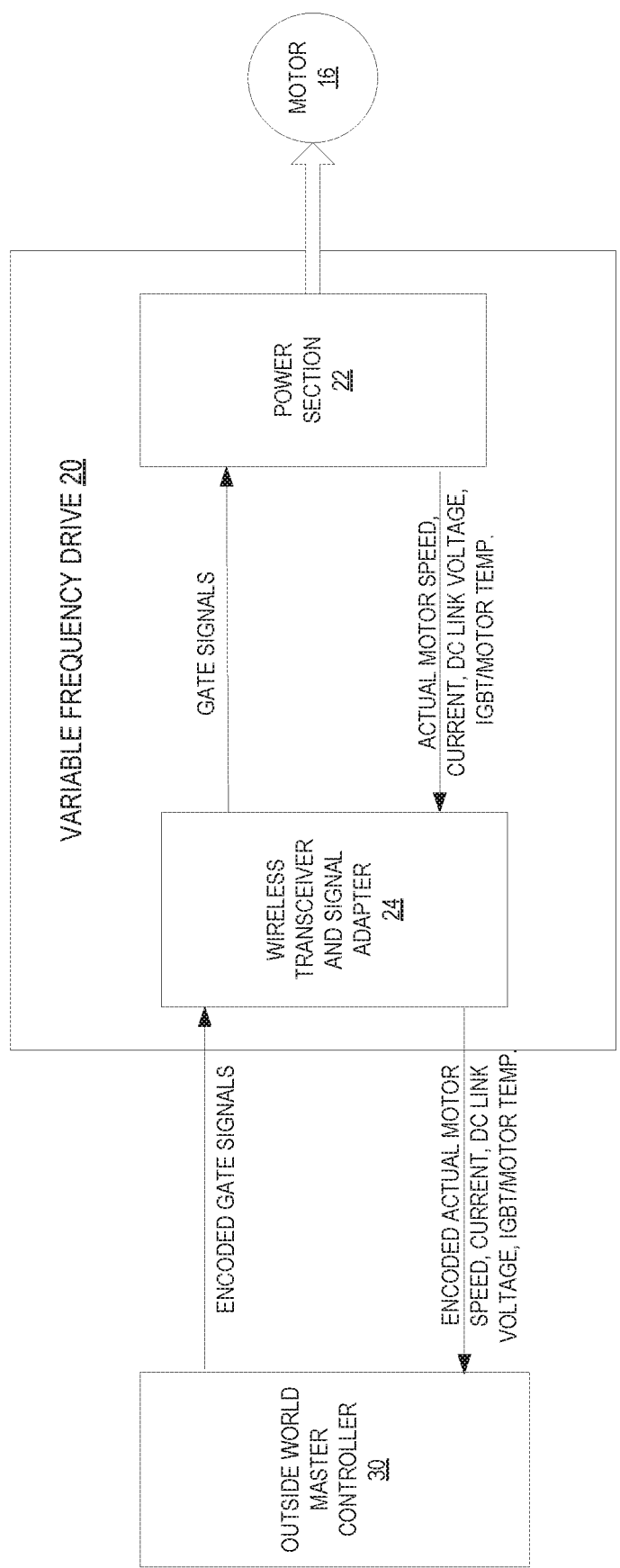
FIG. 9 is a schematic diagram of an exemplary VFD without an on-board controller.

FIG. 9 illustrates an exemplary VFD 20 according to one embodiment without an on-board controller 28. The VFD 20 comprises a power section 22 and a wireless transceiver/signal adapter 24. The wireless transceiver/signal adapter 24 combines a wireless transceiver (e.g., Bluetooth, Narrowband IoT, Profibus, etc.) with a signal adapter for processing the signals transmitted and received by the VFD 20. The signal processing includes, for example, coding and decoding of signals filtering, signal conversion and formatting. The wireless transceiver/signal adapter comprises a microprocessor, hardware circuit, or other processing circuit. The wireless transceiver/signal adapter 24 also contains a sense ADC that converts temperatures and currents to a digital form for transmission. The wireless transceiver/signal adapter 24 receives gate signals from the master controller 30 and outputs the gate signals to the power section 22 and outputs the gate signals to the power section 22. The power section 22 generates the motor drive signals for driving the motor 16.

Figure 10:
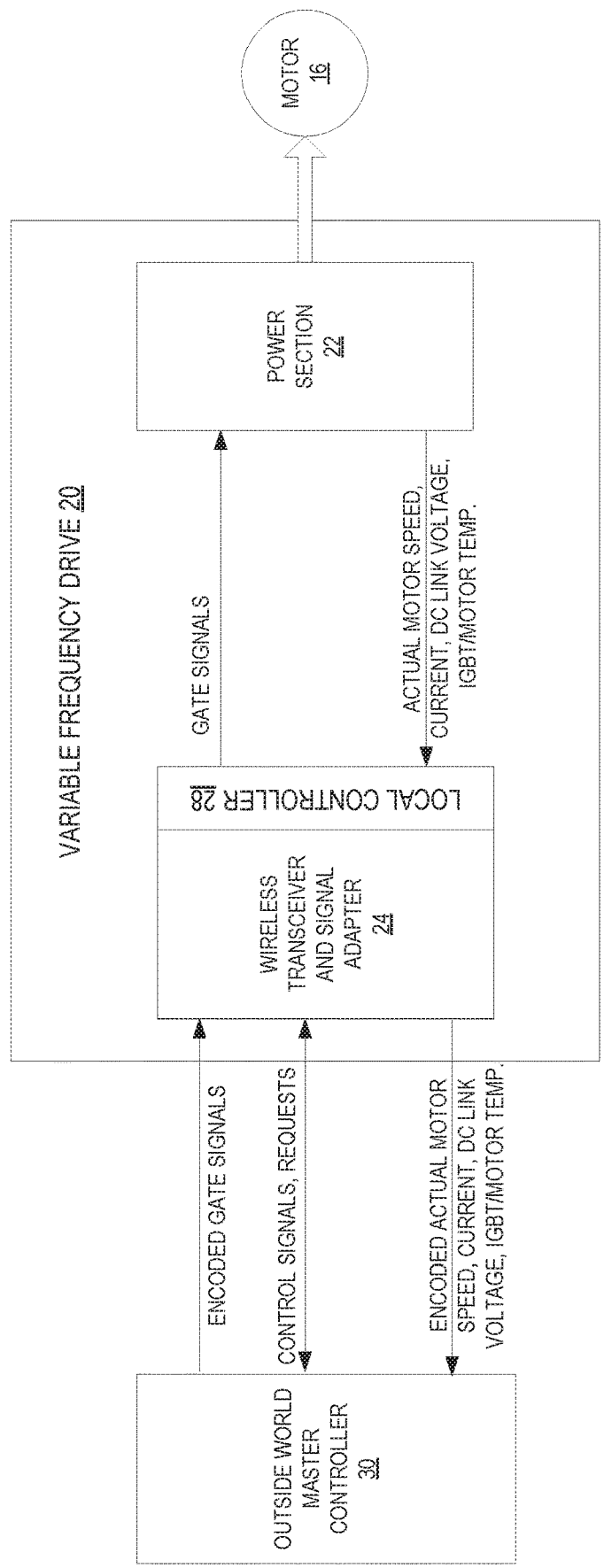
FIG. 10 is a schematic diagram of an exemplary VFD with an on-board controller.

FIG. 10 illustrates an exemplary VFD 20 according to one embodiment with an on-board controller 28. The VFD 20 comprises a power section 22 and a wireless transceiver/signal adapter 24. The wireless transceiver/signal adapter 24 combines a wireless transceiver (e.g., Bluetooth, Narrowband IoT, Profibus, etc.) with a signal adapter for processing the signals transmitted and received by the VFD 20. The signal processing includes, for example, coding and decoding of signals filtering, signal conversion and formatting. The signal adapter comprises a microprocessor, hardware circuit, or other processing circuit. The wireless transceiver/signal adapter 24 also contains a sense ADC that converts temperatures and currents to a digital form for transmission. The wireless transceiver/signal adapter 24 receives gate signals and/or control signals from the master controller 30 and passes them to the local controller 28. In one operating mode, the local controller 28 outputs the gate signals to the power section 22 received from the master controller 30 to the power section 22. In a "headless" mode, the local controller 28 may generated the gate signal locally and output the gate signals to the power section 22. The local controller 28 can exchange control signals with the master controller 30 via the wireless transceiver/signal adapter 24.

Figure 11:
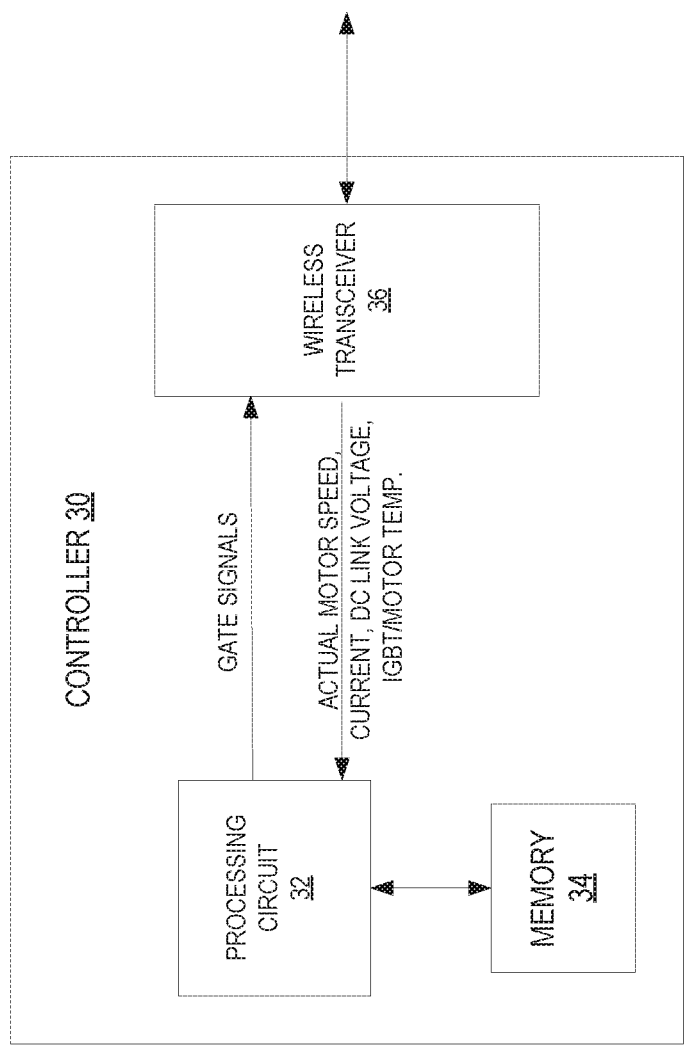
FIG. 11 is a schematic diagram of an exemplary controller.

FIG. 11 illustrates an exemplary controller 30 according to one embodiment without an on-board controller 28. The controller 30 comprises a processing 32, memory 34, and a wireless transceiver 36 (e.g., Bluetooth, Narrowband IoT, Profibus, etc.). The processing circuit 32 comprises one or more microprocessors, hardware circuits, firmware, or a combination thereof for generating the gate signals as herein described and for controlling the operation of the VFDs 20. Processing circuit 32 executes computer program instructions which are stored in memory 34. Memory 34 stores the computer programs and data needed by the processing circuit 32 to perform its functions. Memory 34 may comprise both non-volatile memory (e.g. electrically erasable programmable read-only memory (EEPROM) or flash memory) for storing computer programs and instructions, and volatile memory (e.g. random access memory (RAM)) for storing temporary data. The processing circuit generates the gate signals and/or control signals as herein described. The wireless transceiver 34 transmits the gate signals and/or control signals to the VFDs 20. The wireless transceiver 34 also receives feedback signals and/or control signals from the VFDs 20 and passes these signals to the processing circuit 32.

Figure 12:
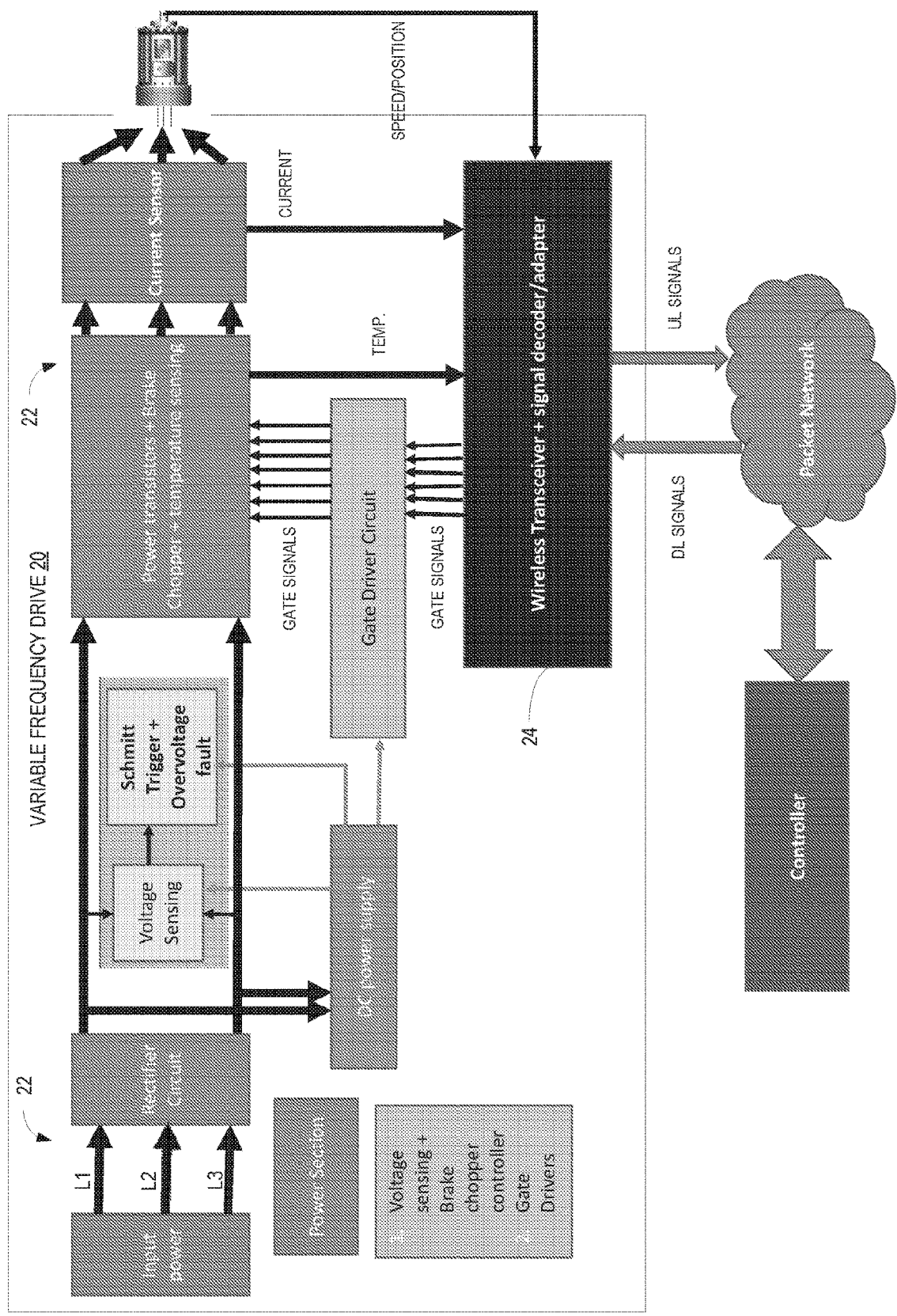
FIG. 12 is a detailed block diagram of an exemplary VFD without an on-board controller.

FIG. 12 is a detailed block diagram of an exemplary VFD 20 without an on-board controller. The embodiment in FIG. 12 corresponds generally to the schematic drawing in FIG. 9. The power section 22 is represented by the components of the VFD 20 shown in blue.

Figure 13:
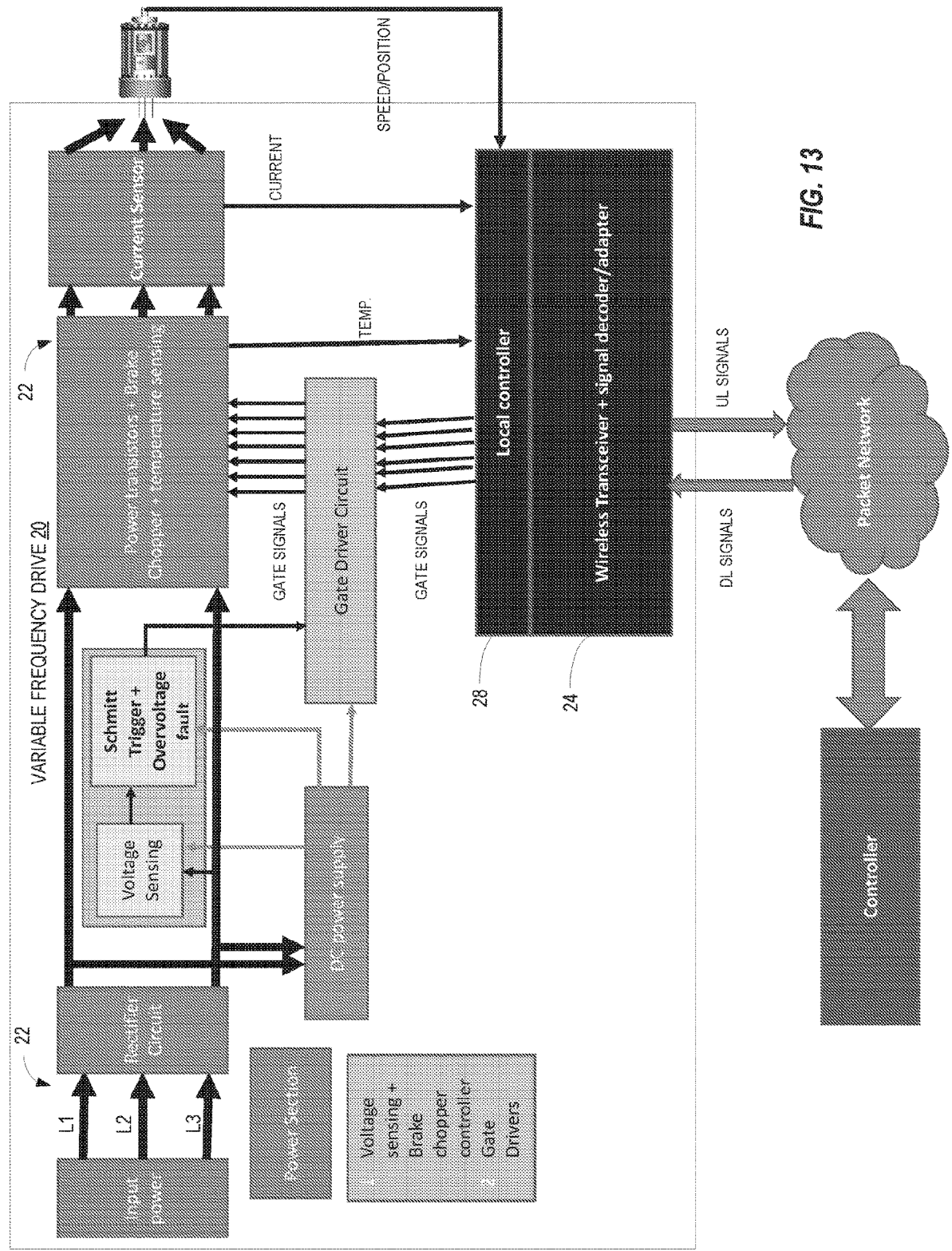
FIG. 13 is a detailed block diagram of an exemplary VFD with an onboard controller.

FIG. 13 illustrates an exemplary controller 30 according to one embodiment without an on-board controller 28. The embodiment in FIG. 12 corresponds generally to the schematic drawing in FIG. 10. The power section 22 is represented by the components of the VFD 20 shown in blue.

Figure 14:
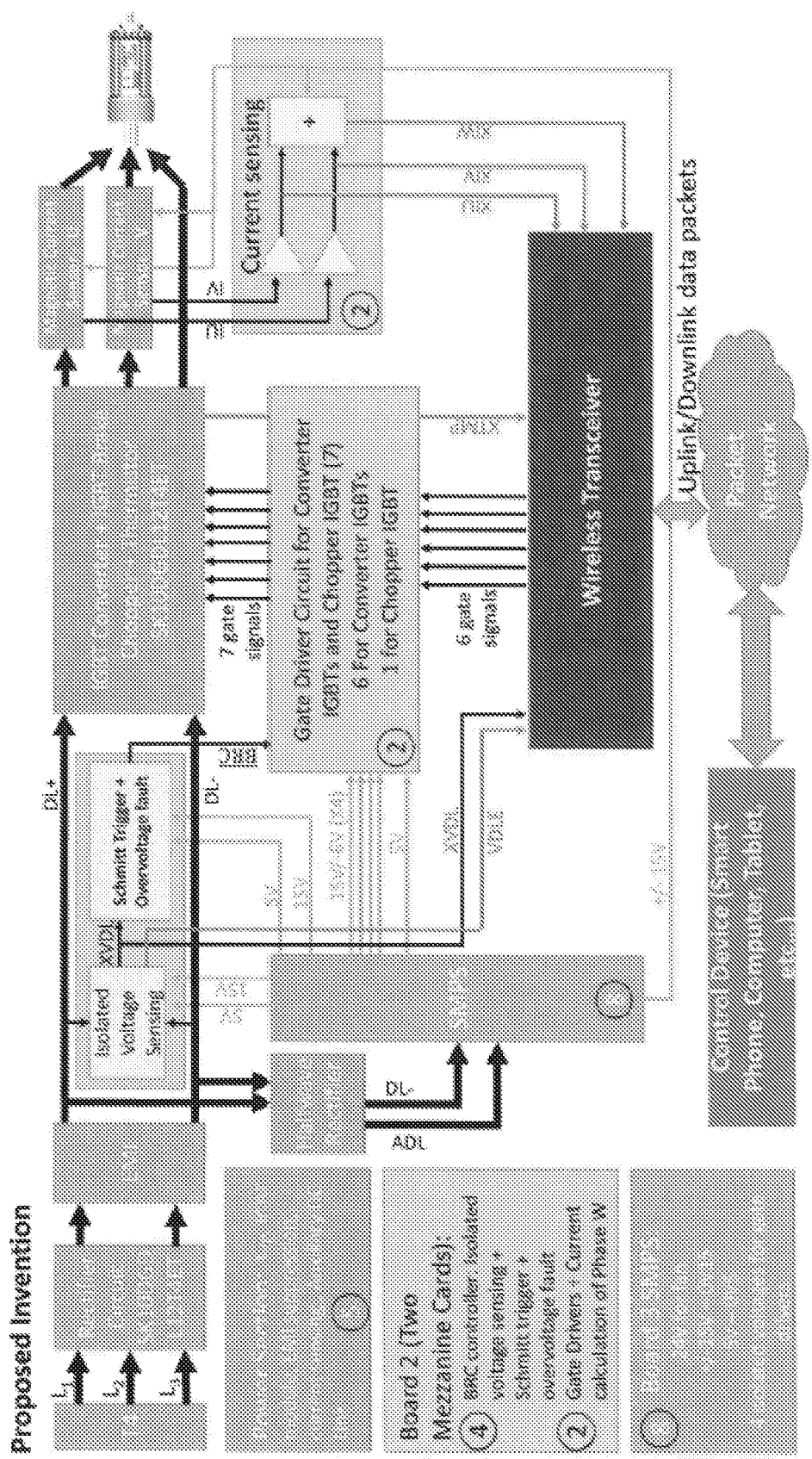
FIG. 14 is another detailed block diagram of an exemplary VFD without an on-board controller.

FIG. 14 is another detailed block diagram of an exemplary VFD 20 without an on-board controller 28. The embodiment in FIG. 14 corresponds generally to the schematic drawing in FIG. 9. The power section 22 is represented by the components of the VFD 20 shown in blue.

Embodiments of the present invention present numerous advantages over VFDs 20 according to the prior art.

Controller 20 can become agnostic of the structure of the VFD 20, its brand, its analog and digital input/outputs etc. It does not have to worry about how many digital inputs there are or how the VFD 20 interprets them. No prior setup or commissioning is required. Controller 20 sends the low level gate switching signals based on its calculations.

Updating the VFD's program or functionality becomes an easy task and can be done seamlessly because the VFD 20 merely sees the gate signals without having to execute any instructions, do any computations or interpret any digital inputs.

In applications that require synchronous operation, the controller 30 can multicast one packet to all VFDs 20 that are supposed to run at the same speed, simplifying the control process. Because their uplink data has a low rate, the controller 30 can 'listen' to all of them and broadcast appropriate packets or send individual packets to each VFD 20.

Separating control from power sections 12 revolutionizes industrial site management because all data is made available in a more convenient location than the VFD's 10 location. Engineers and technicians do not have to go to the VFD 20 location—which can be challenging due to height, temperature, dust, danger of moving objects etc., to read parameters, set speed, or connect a laptop. All data are available to them in a remote control room.

In applications that require coordinated motion (e.g. axes of a storage system), a single controller 30 can monitor individual VFDs 20 and sensors without the need for expensive cabling, maintenance etc.

Controller handover scenarios can be made possible seamlessly without the VFD 20 even noticing that its controller has changed. What is meant by controller handover is that one controller 30 can handover control to another controller 30 due to mobility, offloading, etc.

VFD 20 handover scenarios like conveyor applications are very good use cases for embodiments of the present invention because the same controller 30 knows when one VFD 20 approaches its target, when it must stop and when the subsequent one must take over even without proximity sensors because the controller stores the speed and hence the distance traveled by the conveyor section.

More advanced algorithms can be utilized because the processing now resides in more powerful computers than simple PLCs/micro-controllers. For example, for the speed and torque controllers, Kalman filters can be used instead of the less robust PI controllers because PI controllers require knowledge of load parameters which are not available in most cases.

More advanced switching technology can be used like multi-level PWM as opposed to bipolar PWM. Multi-level switching is a known technology that has some advantages over bipolar PWM since it reduces the harmonic distortion but it is not usually implemented due to its high complexity. By moving the processing to a more powerful controller that does all the calculations and sends only low level instructions to the VFD 20, a more complex technology like multi-level switching can be easily realized.

The controller residing in more powerful computers can run more advanced algorithms than what can run in an embedded VFD micro controller.

The packet network used to connect the controller to the network of VFDs and to allow the VFDs to peer to each other can be wired or unwired The control messages exchanged are L2/L3/L4 packets and are used to control and monitor the VFDs.

The network of VFDs can be centrally controlled by a controller, and allow as well for distributed control to allow on VFD to relay control messages or control/monitor another VFD.

Deterministic packet network can be used to guarantee delivery and latency for the VFD real time application.

All VFDs control can be offloaded to a controller, or VFDs can still maintain some local control to control its operation or other VFDs operation.

Communication between controller and the network of VFDs or between VFDs can be protected against attacks using security techniques such as encryption and authentication to guarantee confidentiality and integrity of the communication.

VFDs can be addressed in the packet network using a L2 MAC address and a L3 address.

The present invention may, of course, be carried out in other ways than those specifically set forth herein without departing from essential characteristics of the invention. The present embodiments are to be considered in all respects as illustrative and not restrictive.

What is claimed is:

1. A method of controlling one or more Variable Frequency Drives (VFD), each VFD configured to generate a Pulse Wdth Modulated (PWM) signal to drive a motor, characterized by:
for each controlled VFD, calculating a plurality of drive signals to switch a plurality of power transistors in the VFD for a first time interval, to generate a desired PWM signal; and
wirelessly transmitting, in advance of the first time interval, the plurality of drive signals to respective VFDs in at least a main downlink (DL) frame of a transmission packet.

2. The method of claim 1 wherein wirelessly transmitting a plurality of drive signals comprises transmitting a plurality of drive signals in a plurality of successive time intervals including the first time interval, wherein the drive signals transmitted in one of the successive time intervals is effective for the next time interval.

3. The method of claim 1 wherein the drive signals comprise separate indications to switch each power transistor on or off, and also indicate the timing of the switching.

4. The method of claim 3 wherein the drive signals further comprise an indication to switch a braking transistor on or off, and also indicate the timing of the switching.

5. The method of claim 3 wherein the timing of each transistor switching signal is an offset from the beginning of the next time interval.

6. The method of claim 3 further comprising:
in one or more of the time intervals, additionally transmitting commands or parameter values to one or more VFDs in an auxiliary DL frame of the transmission packet.

7. The method of claim 6 further comprising:
transmitting a command in an auxiliary DL frame for the VFD to run autonomously; and
ceasing the transmission of drive signals in a main DL frame to the autonomous VFD.

8. The method of claim 7 further comprising:
transmitting a command in an auxiliary DL frame for the VFD to be controlled; and
resuming the transmission of drive signals in a main DL frame to the autonomous VFD.

9. The method of claim 3 further comprising:
in one or more of the time intervals, receiving from one or more VFDs feedback about the VFD or motor state in a main uplink (UL) frame of a received packet.

10. The method of claim 1 wherein the same drive signals, commands, or parameter values are broadcast to two or more controlled VFDs.

11. The method of claim 1 wherein the drive signals, commands, or parameter values are transmitted individually to each controlled VFD.

12. A controller configured to control one or more Variable Frequency Drives (VFD), each VFD configured to generate a Pulse Wdth Modulated (PWM) signal to drive a motor, the controller comprising:
a processor operatively connected to the wireless transceiver, and configured to:
for each controlled VFD, calculate a plurality of drive signals to switch a plurality of power transistors in the VFD for a time interval, to generate a desired PWM signal; and
wirelessly transmit the plurality of drive signals, to each controlled VFD, in advance of the time interval in which they are to be applied, in at least a main downlink (DL) frame of a transmission packet.

13. A method of generating a Pulse Width Modulated (PWM) signal to drive a motor, by a Variable Frequency Drive (VFD) controlled by a remote controller, comprising:
wirelessly receiving from the controller, in a main downlink (DL) frame of a received packet, a plurality of drive signals for a time interval; and
in a subsequent time interval, switching a plurality of power transistors, according to the received drive signals, to generate the PWM signal.

14. The method of claim 13 wherein wirelessly receiving a plurality of drive signals comprises receiving the plurality of drive signals in each successive time interval, and wherein a subsequent time interval comprises the next time interval.

15. The method of claim 13 wherein the drive signals comprise separate indications to switch each power transistor on or off, and also indicate the timing of the switching.

16. The method of claim 15 wherein the drive signals further comprise an indication to switch a braking transistor on or off, and also indicate the timing of the switching.

17. The method of claim 15 wherein the timing of each transistor switching signal is an offset from the beginning of the next time interval.

18. The method of claim 13 further comprising:
in one or more of the time intervals, additionally receiving commands or parameter values in an auxiliary DL frame of the received packet.

19. The method of claim 18 further comprising:
receiving a command in an auxiliary DL frame to run autonomously; and
generating drive signals to switch the transistors.

20. The method of claim 19 further comprising:
receiving a command in an auxiliary DL frame to again be controlled; and
resuming switching the transistors according to drive signals received in each time interval from the controller.

21. The method of claim 13 further comprising:
in one or more of the time intervals, wirelessly transmitting to the controller feedback about the VFD or motor state in a main uplink (UL) frame of a transmitted packet.

22. The method of claim 21 wherein the feedback includes one or more of instantaneous motor speed, instantaneous motor current, power transistor temperature, motor rotor temperature, DC bus voltage, and an indication for the controller to calculate motor speed from current and voltage.

23. The method of claim 21 further comprising:
in one or more of the time intervals, wirelessly transmitting to the controller the value of one or more parameters in an auxiliary uplink (UL) frame of a transmitted packet.

24. A Variable Frequency Drive (VFD) configured to generate a Pulse Width Modulated (PWM) signal to drive a motor, controlled by a remote controller, said VFD comprising:
- a transceiver; and
- a processor operatively connected to the wireless transceiver, and configured to:
  - wirelessly receive from the controller, in a main downlink (DL) frame of a received packet, a plurality of drive signals for a time interval; and
  - in a subsequent time interval, switch a plurality of power transistors, according to the received drive signals, to generate the PWM signal.

* * * * *